United States Patent
Han et al.

(10) Patent No.: US 9,574,959 B2
(45) Date of Patent: Feb. 21, 2017

(54) VARIOUS STRESS FREE SENSOR PACKAGES USING WAFER LEVEL SUPPORTING DIE AND AIR GAP TECHNIQUE

(71) Applicant: Apple Inc., Cupertino, CA (US)

(72) Inventors: Caleb C. Han, Sunnyvale, CA (US); Tongbi Jiang, Santa Clara, CA (US); Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/517,387

(22) Filed: Oct. 17, 2014

(65) Prior Publication Data

US 2016/0061677 A1    Mar. 3, 2016

Related U.S. Application Data

(60) Provisional application No. 62/044,857, filed on Sep. 2, 2014.

(51) Int. Cl.
| | |
|---|---|
| H01L 29/84 | (2006.01) |
| H01L 21/50 | (2006.01) |
| G01P 15/12 | (2006.01) |
| G01P 15/08 | (2006.01) |
| B81B 7/00 | (2006.01) |
| G01L 7/08 | (2006.01) |
| H01L 41/113 | (2006.01) |
| H01L 41/09 | (2006.01) |

(52) U.S. Cl.
CPC ............... *G01L 7/08* (2013.01); *B81B 7/0048* (2013.01); *H01L 41/094* (2013.01); *H01L 41/1136* (2013.01); *H01L 2924/1461* (2013.01)

(58) Field of Classification Search
CPC ............ H01L 29/84; H01L 2924/1461; H01L 41/094; H01L 41/0946; H01L 41/113; H01L 41/1132; H01L 41/1136
See application file for complete search history.

(56) References Cited

U.S. PATENT DOCUMENTS

| 6,767,757 B2 | 7/2004 | Kang et al. |
| 7,499,604 B1 | 3/2009 | Burns |
| 8,350,445 B1 | 1/2013 | Shirakawa et al. |

(Continued)

FOREIGN PATENT DOCUMENTS

| EP | 2 426 083 A2 | 3/2012 |
| EP | 2 455 329 A2 | 5/2012 |

(Continued)

OTHER PUBLICATIONS

PCT International Search Report and Written Opinion for International Application No. PCT/US2015/046803, mailed Nov. 10, 2015, 9 pages.

*Primary Examiner* — Pamela E Perkins
(74) *Attorney, Agent, or Firm* — Blakely, Sokoloff, Taylor & Zafman LLP

(57) ABSTRACT

Sensor packages and manners of formation are described. In an embodiment, a sensor package includes a supporting die characterized by a recess area and a support anchor protruding above the recess area. A sensor die is bonded to the support anchor such that an air gap exists between the sensor die and the recess area. The sensor die includes a sensor positioned directly above the air gap.

22 Claims, 16 Drawing Sheets

(56) References Cited

U.S. PATENT DOCUMENTS

| | | | |
|---|---|---|---|
| 2005/0092095 A1* | 5/2005 | Borzabadi | G01L 9/06 |
| | | | 73/754 |
| 2005/0194685 A1 | 9/2005 | Weiblen et al. | |
| 2008/0315333 A1 | 12/2008 | Combi et al. | |
| 2012/0139067 A1* | 6/2012 | Lo | G01L 19/147 |
| | | | 257/417 |
| 2012/0299439 A1 | 11/2012 | Huang | |

FOREIGN PATENT DOCUMENTS

| | | | |
|---|---|---|---|
| JP | 2000-338126 | * | 12/2000 |
| JP | 2000-338126 A | | 12/2000 |
| WO | WO 2013118139 A1 | | 8/2013 |

* cited by examiner

A lid can additionally be located over the motion sensor die. In an embodiment, the lid is

VARIOUS STRESS FREE SENSOR PACKAGES USING WAFER LEVEL SUPPORTING DIE AND AIR GAP TECHNIQUE

RELATED APPLICATIONS

This application claims the benefit of priority from U.S. Provisional Patent Application Ser. No. 62/044,857 filed on Sep. 2, 2014, which is incorporated herein by reference.

BACKGROUND

Field

Embodiments described herein relate to semiconductor packaging. More particularly embodiments relate to sensor packages and manners of fabrication.

Background Information

Sensor die can be formed from customized integrated circuits. Sensors are often used to sense environmental characteristics or act as a user input for electronic products. Sensors, unlike some general purpose integrated circuits, can have unique packaging and mounting requirements since sensors often require exposure to an ambient external environment, such as an ambient environment of a user using the electronic product having the sensor. As electronic products are becoming increasingly sophisticated and the size of the overall packages is reduced to meet market needs, these advances are associated with various packaging challenges to reduce cost and form factor of the packages.

SUMMARY

Sensor packages and methods of formation are described. In an embodiment, a sensor package includes a supporting die characterized by a recess area and a support anchor protruding above the recess area. A sensor die is bonded to the support anchor such that an air gap exists between the sensor die and the recess area. The sensor die may be bonded to the support anchor in a single-sided support cantilever configuration such that a hanging area of the sensor die extends laterally from a contact area of the sensor die directly over the support anchor, and the air gap exists between the hanging area of the sensor die and the recess area. The sensor die includes a sensor positioned directly above the air gap. The sensor package may additionally include one or more stopper structures protruding above the recess area. In this manner, the stopper structures can provide structural integrity to the sensor package and protect the bond between the sensor die and supporting die from breaking due to excessive bending into the air gap. For example, the stopper structures and support anchor may be integrally formed. In an embodiment, the sensor is positioned entirely directly above the air cavity.

Supporting die can be formed from various types of substrates depending upon application such as a bulk substrate, interposer, and integrated circuit (IC) die, such as an application specific integrated circuit (ASIC). Depending upon application, a through via interconnect may be formed through the supporting die, for example, for routing signal to output leads. Depending upon application, a separate IC die can be provided between the sensor die and supporting die, or provided on top of the sensor die. Additionally, the motion sensor die can be bonded to a stack of multiple supporting die. The support anchors for each of the multiple supporting die can assume a variety of arrangements, such as being orthogonally aligned or not being directly above one another.

In an embodiment, the sensor package is a wafer level pressure sensor package. In such an embodiment, the pressure sensor package includes a supporting IC characterized by a recess area and a support anchor protruding above the recess area. A sensor die is bonded to the support anchor such that an air gap exists between the sensor die and the recess area. The sensor die includes a pressure sensor positioned directly above the air gap. In an embodiment, the pressure sensor includes a diaphragm that is immediately adjacent the air cavity. In addition, a through via extends through a base substrate of the supporting IC die. Stopper structures may additionally protrude from the recess area.

In an embodiment, the sensor package is a wafer level motion sensor package. In such an embodiment, the motion sensor package includes a supporting interposer die with a top surface characterized by a recess area and a support anchor protruding above the recess area. An IC die is bonded to the support anchor such that an air gap exists between the IC die and the recess area, and a sensor die bonded to the IC die. The sensor die includes a motion sensor positioned directly above the air gap. A through via may extend though a base substrate of the supporting interposer die. A second through via may additionally extend through the IC die, such as an ASIC.

The sensor package may be a pressure sensor package compatible with land grid array (LGA), quad flat no-leads (QFN), and ceramic packaging substrates. In such an embodiment, the pressure sensor package includes a supporting die characterized by a recess area and a support anchor protruding above the recess area. A sensor die is bonded to the support anchor such that an air gap exists between the sensor die and the recess area. The sensor die includes a pressure sensor positioned directly above the air gap, and a lid is provided over the pressure sensor die. The lid may include a pressure inlet for operation of the pressure sensor. In an embodiment, the supporting die is bonded to an IC die. The IC die may be bonded to a surface mount substrate, such as an LGA, QFN, or ceramic substrate. In such a configuration, the lid is bonded to the surface mount substrate and surrounds the IC die, the supporting die, and the sensor die. In embodiment, the surface mount substrate is a ceramic substrate including sidewalls that surround the IC die, the supporting die, and the sensor die. Wire bonding may be used to electrically connect the sensor die to the surface mount substrate or the IC die. Wire bonding may also be used to electrically connect the IC die to the surface mount substrate.

The sensor package may be a motion sensor package compatible with LGA, QFN, or ceramic packaging substrates. In such an embodiment, the motion sensor package includes a supporting die with a top surface characterized by a recess area and a support anchor protruding above the recess area. A sensor die is bonded to the support anchor such that an air gap exists between the sensor die and the recess area. The sensor die includes a motion sensor positioned directly above the air gap, and an integrated circuit (IC) die bonded to the sensor die. In an embodiment, the sensor die includes a base substrate and a cap surrounding the motion sensor. In an embodiment, the supporting die is bonded to a surface mount substrate, such as an LGA, QFN, or ceramic substrate. Wire bonding may be used to electrically connect the IC die to the sensor die, and the IC die to the surface mount substrate. A lid can additionally be located over the motion sensor die. In an embodiment, the lid is bonded to the surface mount substrate, and the lid surrounds the supporting die, the sensor die, and the IC die. In an embodiment, the surface mount substrate is a ceramic substrate including sidewalls that surround the supporting die, the sensor die, and the IC die.

In an embodiment, a method of assembling a sensor package includes bonding a sensor wafer including an array of sensors to a supporting wafer comprising an array of cavities, where each sensor is directly above a corresponding cavity. An array of sensor packages is then singulated from the bonded sensor wafer and supporting wafer, wherein each sensor package includes a corresponding sensor directly above an air cavity. In an embodiment, the method includes etching the array of cavities in the supporting wafer. In an embodiment, the method includes forming an array of support anchors and an array of stopper structures on the supporting wafer.

BRIEF DESCRIPTION OF THE DRAWINGS

FIG. 10B is a cross-sectional side view illustration of a stacked sensor die and multiple supporting die taken along cross-section X-X of FIG. 10A in accordance with an embodiment.

FIG. 10C is a cross-sectional side view illustration of a stacked sensor die and multiple supporting die taken along cross-section Y-Y of FIG. 10A in accordance with an embodiment.

DETAILED DESCRIPTION

Figure 1:
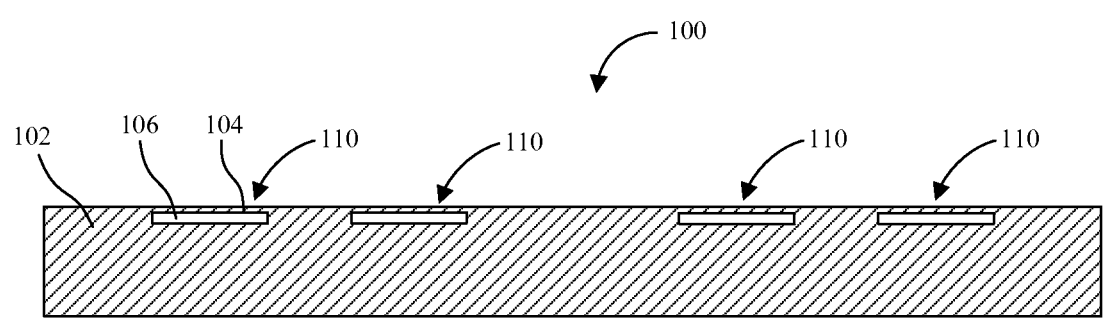
FIG. 1 is a cross-sectional side view illustration of a sensor wafer in accordance with an embodiment.

Embodiments describe sensor packages and methods of fabrication. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between" and "on" as used herein may refer to a relative position of one layer with respect to other layers. One layer "above", "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe sensor packages and manners of fabrication which may address sensor package stress. It has been observed that sensor devices are sensitive to package stress, particularly pressure and motion sensors. For example, thermo-mechanical stress from the package or underlying substrate can cause sensor output shift, particularly as temperature changes. In addition, package stress impact to sensor output change may become more serious when package thickness and form factor are further reduced to meet market needs. In an embodiment, a wafer level supporting die and air gap technique is described in order to alleviate the impact of package stress on sensor devices. A supporting wafer having recessed areas is bonded with a sensor wafer using a wafer level bonding process. After singulation, the stacked die include a supporting die with a recess area and support anchor, and a sensor die bonded to the support anchor such that an air gap exists between the sensor die and the recess area. This stacked die arrangement can be integrated into a variety of sensor packages and may be compatible with both wafer level packaging (WLP) in which the top and bottom die (and solder bumps) are attached while still at the wafer scale, and for integration with surface mount substrates such as LGA, QFN, or ceramic substrates. Various surface mount interconnection methods may be used for electrically connecting the stacked die arrangement, such as flip chip bonding, wire bonding, and combinations of flip chip bonding and wire bonding. In an embodiment, the sensor die includes a sensor positioned directly above the air gap. In this manner, the support anchor and air gap between the sensor die and the supporting die may isolate stress away from the sensor while also supporting the sensor die.

In an embodiment of a wafer level supporting die and air gap technique, a portion of the sensor die including the sensor hangs above an air gap between the sensor die and a recess area in a supporting die. For example, this may be characterized as a cantilever-type configuration. In such a configuration, the sensor is contained within or on the sensor die. Thus, the sensor is not characterized by the cantilever-type structure, rather the cantilever-type structure diverts stress away from the sensor. Accordingly, the sensor may operate independently of the cantilever-type structure. In an embodiment of a wafer level supporting die and air gap technique, a sensor die is bonded to a pivot platform of a supporting die. In this manner the supporting die is able to divert stress away from the sensor die bonded to the pivot platform.

In the following description with regard to FIGS. 1-10J, various methods and configurations are described for forming a stacked die including a sensor die bonded to one or more supporting die. It is to be appreciated, that while FIGS. 1-10J are described and illustrated with regard to a stacked die including a surface-micromachined pressure sensor, that the processing sequences and structural configurations may also be used for other sensors, such as bulk-micromachined pressure sensors and motion sensors. In addition, the processing sequences may be compatible with both wafer level packages (WLP), and integration with surface mount substrates such as LGA, QFN, and ceramic substrates.

Figure 2:
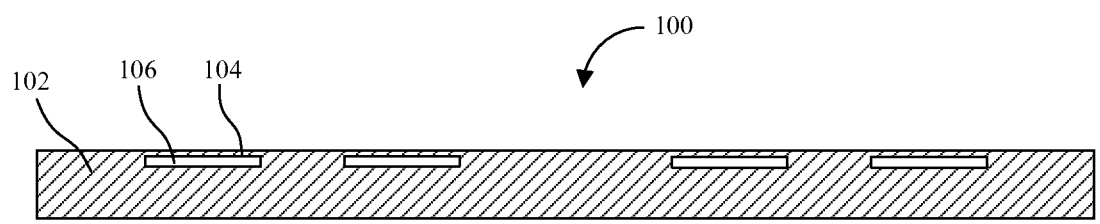
FIG. 2 is a cross-sectional side view illustration of a thinned down sensor wafer in accordance with an embodiment.

Referring now to FIGS. 1-2, cross-sectional side view illustrations are provided of a sensor wafer 100 in accordance with an embodiment. In the particular embodiment illustrated in FIG. 1 sensor wafer 100 includes an array of pressure sensors 110. The pressure sensors 110 may be formed using a variety of fabrication techniques such as wafer bonding of silicon wafers, or any suitable semiconductor processing or MEMS fabrication technique. In the particular embodiment illustrated, the sensors 110 are formed using a surface-micromachined method and include diaphragms 104 formed over corresponding cavities 106 on a substrate 102, such as a silicon substrate. In such a configuration, the diaphragms 104 may deflect outward away from the substrate 102 and inward toward the corresponding cavities 106. After fabrication of the sensors 110 on the sensor wafer 100, the full thickness of the substrate 102, e.g. silicon substrate, can be thinned down as illustrated in FIG. 2 for subsequent wafer bonding. In other embodiments, the sensors are formed using a bulk-micromachined method, and still may be characterized as including diaphragms 104 over corresponding cavities 106.

Figure 3:
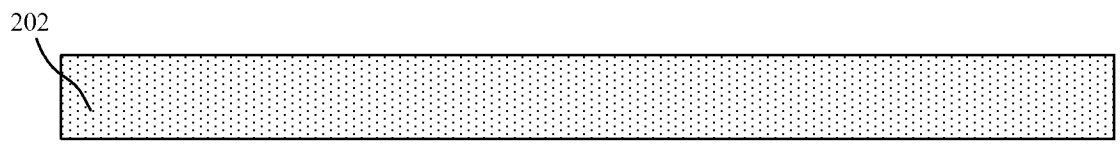
FIGS. 3-5 are cross-sectional side view illustrations of a manner for forming a supporting wafer in accordance with an embodiment.
Figure 4:
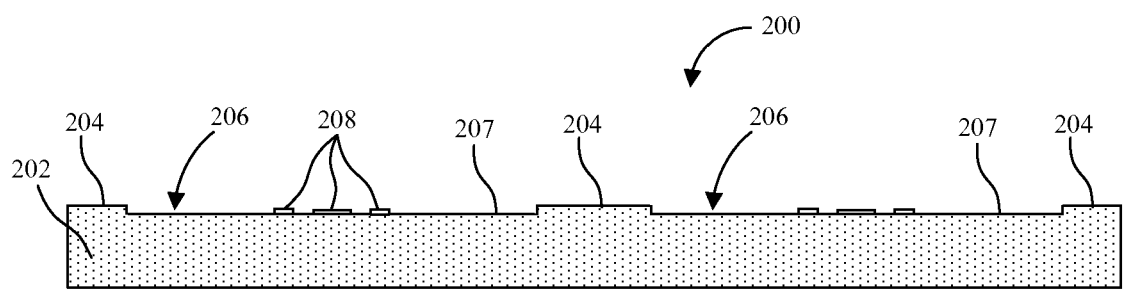
Figure 5:
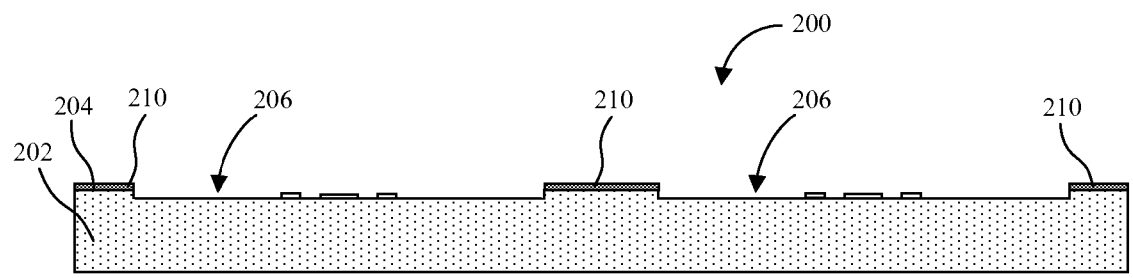

FIGS. 3-5 include cross-sectional side view illustrations of a manner for forming a supporting wafer 200 in accordance with an embodiment. Referring to FIG. 3, the process may begin with a base substrate 202, such as a silicon wafer. Recess areas 207 are etched into the base substrate 202 using dry reactive ion etching (DRIE) or any suitable anisotropic etching technique. In an embodiment, the formation of recess areas 207 results in the formation of support anchors 204 that protrude above the recess areas 207. Stopper structures 208 may also optionally be formed. In an embodiment, stopper structures 208 are formed at the same time as the formation of recess areas 207. In an embodiment, stopper structures 208 and support anchors 204 are integrally formed with the base substrate 202. In an embodiment, stopper structures 208 and support anchors 204 have the same height. Stopper structures 208 may also be formed such that support anchors 204 are taller than the stopper structures. In an embodiment, stopper structures 208 may be deposited after the formation of recess areas 207. As described in further detail below, stopper structures 208 may be formed to prevent breaking of the bonded contact area between the supporting die and sensor die of in the resultant die stack. In an exemplary application, recess areas 207 have a depth of approximately 10 μm, with support anchors 204, and optionally, stopper structures 208 protruding approximately 10 μm above the recess areas.

Figure 6:
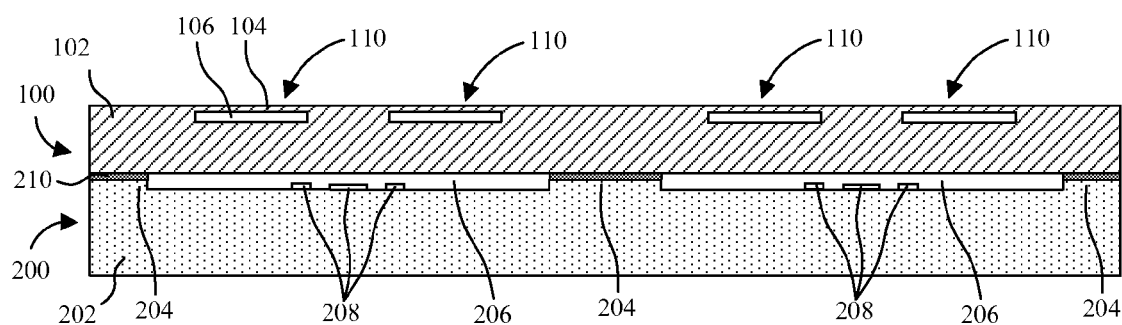
FIG. 6 is a cross-sectional side view illustration a bonded sensor wafer and supporting wafer in accordance with an embodiment.
Figure 7:
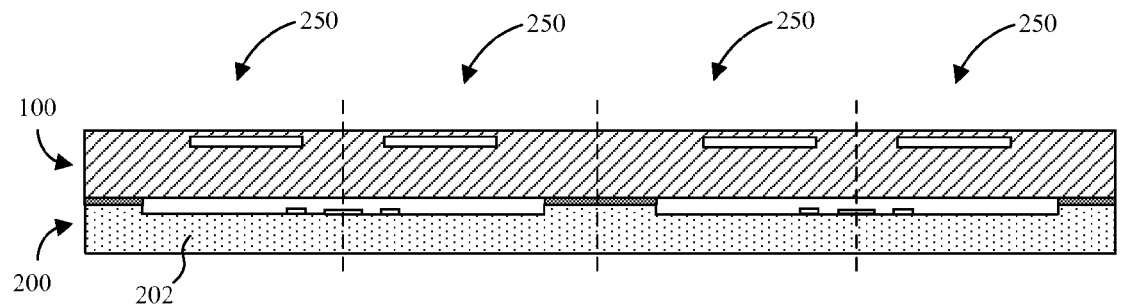
FIG. 7 is a cross-sectional side view illustration of thinning down a supporting wafer after bonding the sensor wafer and supporting wafer in accordance with an embodiment.

Referring now to FIG. 5, a wafer bonding material 210 is applied to the supporting wafer 200. In the particular embodiment illustrated, the wafer bonding material 210 is selectively applied to the support anchors 204. A variety of suitable wafer bonding materials may be used, such as deposited AlGe, or printed, e.g. screen printed, glass paste. In an embodiment, the wafer bonding material 210 is applied to the sensor wafer 100 rather than the supporting wafer 200 such that it will align with the support anchors 204 on the supporting wafer 200. The sensor wafer 100 and supporting wafer 200 are then bonded together with the wafer bonding material 210 as illustrated in FIG. 6. In the embodiment illustrated, air gaps 206 are formed between the sensor wafer 100 and supporting wafer 200. For example, air gaps 206 may have a height defined by a height of the support anchors 204 and wafer bonding material 210 thickness. In an embodiment, the air gaps 206 also span over one or more stopper structures 208. In an embodiment, following bonding of the sensor wafer 100 and supporting wafer 200, the supporting wafer 200 can then be thinned down as illustrated in FIG. 7. The bonded, thinned structure may then be diced into die stacks 250. In the particular embodiment illustrated, dicing may be performed along the dotted lines shown in FIG. 7, with adjacent mirror image die stack 250 each being diced from a shared air cavity 206.

Figure 8A:
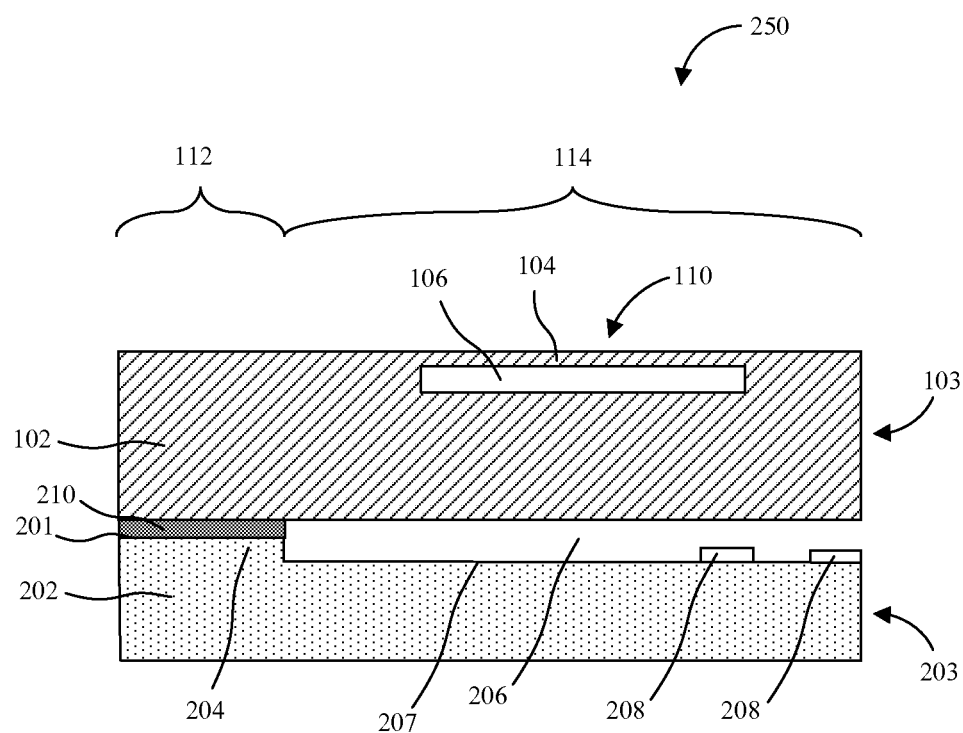
FIG. 8A is a cross-sectional side view illustration of a stacked sensor die and supporting die in accordance with an embodiment.
Figure 8B:
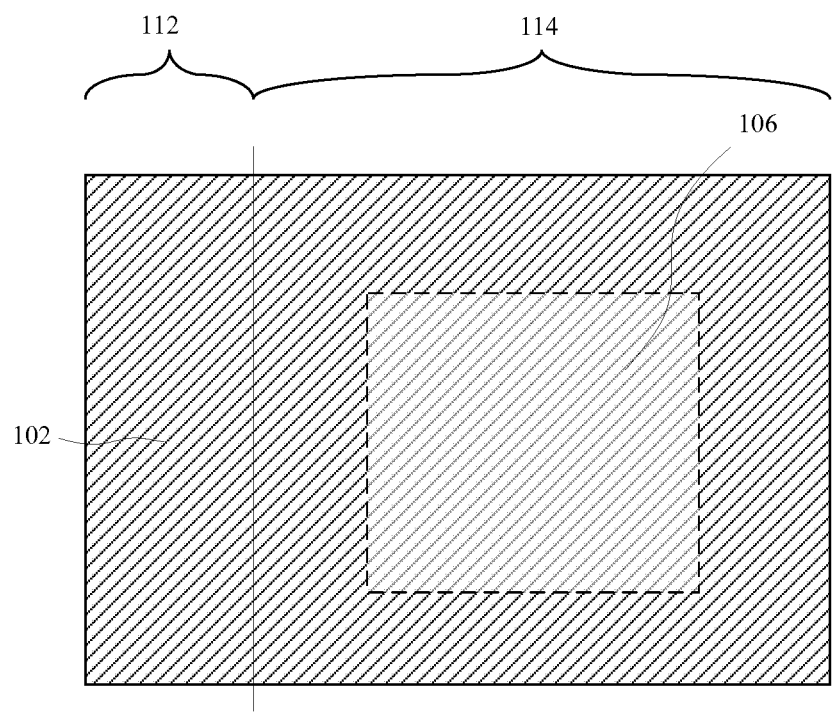
FIG. 8B is a top view illustration of a stacked sensor die and supporting die in accordance with an embodiment.

Referring now to FIGS. 8A-8B, cross-sectional side view and top view illustrations are provided of a singulated die stack in accordance with an embodiment. In the particular embodiment illustrated, the die stack 250 includes a pressure sensor 110. For example, the pressure sensor includes a diaphragm 104 and cavity 106 underneath the diaphragm. The die stack 250 includes a supporting die 203 including a top surface 201 characterized by a recess area 207 and a support anchor 204 protruding above the recess area 207. A sensor die 103 is bonded to the support anchor 204 such that an air gap 206 exists between the sensor die 103 and the recess area 207, and the sensor die 103 includes pressure sensor 110 positioned directly above the air gap 206. One or more stopper structures 208 may protrude from the recess area 207. The support anchor 204 may have the same height, or be taller than the one or more stopper structures 208. In an embodiment, the support anchor 204 and one or more stopper structures 208 are integrally formed with the base substrate 202, such as a silicon substrate. In such a configuration, the top surface 201 is additionally characterized by the stopper structures 208.

In accordance with embodiments, a die stack includes a supported contact area 112 of the sensor die 103, and hanging area 114 of the sensor die that is not bonded to a structure directly underneath. The hanging area 114 may correspond to an area of the air gap 206 directly underneath. The supported contact area 112 may correspond to the bond area between the support anchor 204 and sensor die 103. The amount of supported contact area 112 can be used to isolate stress transfer to the sensor 110, while achieving sufficient mechanical strength. For example, an open air gap 206 may exist at peripheral regions underneath the sensor die 103 along sides not supported by a support anchor 204. For the exemplary rectangular package structure illustrated in FIG. 8B, an open air gap 206 may exist along three edges of substrate 102 of sensor die 103, with a fourth edge being supported by support anchor 204. Such a configuration may be characterized as a single-sided support cantilever shape. However, alternative configurations are possible. For example, multiple edges may be supported by support anchor 204, or one or more edges may be only partially supported by support anchor 204. Accordingly, a variety of configurations are envisioned.

While the embodiments described and illustrated with regard to FIGS. 8A-8B resemble that illustrated in the process described an illustrated in FIGS. 1-7, the process sequence described in FIGS. 1-7 is intended to be exemplary and is not so limited. For example, the process sequence described and illustrated in FIGS. 1-7 may be compatible with alternative sensor types, and die stack configurations for stress isolation, such as those illustrated and described in FIGS. 8C-10J.

Figure 8C:
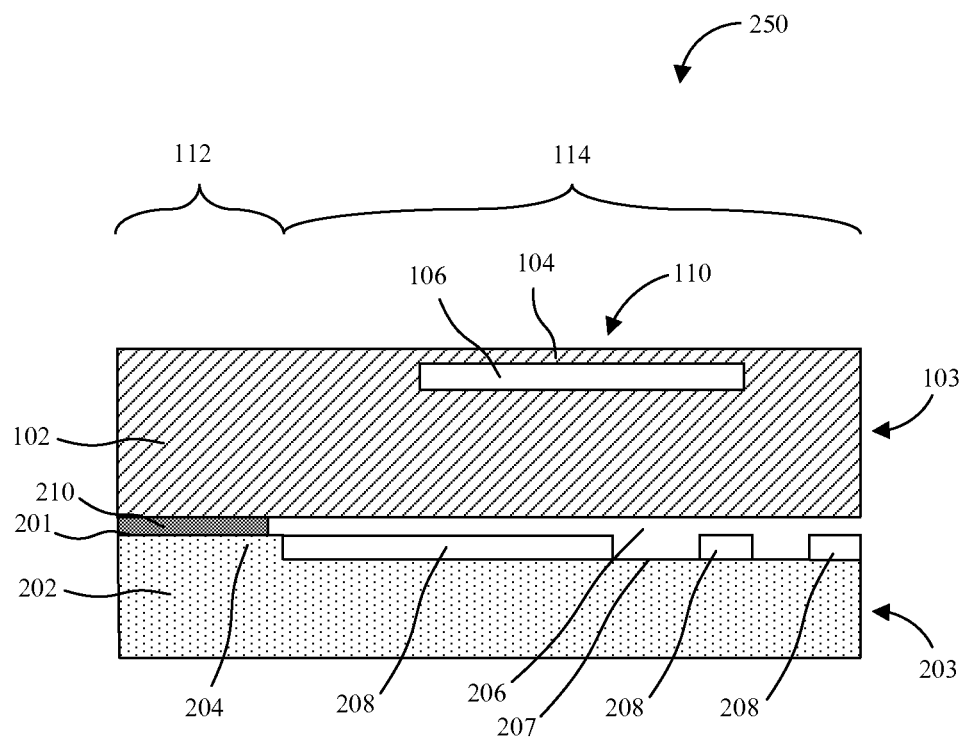
FIG. 8C is a cross-sectional side view illustration of a stacked sensor die and supporting die in accordance with and embodiment.
Figure 8D:
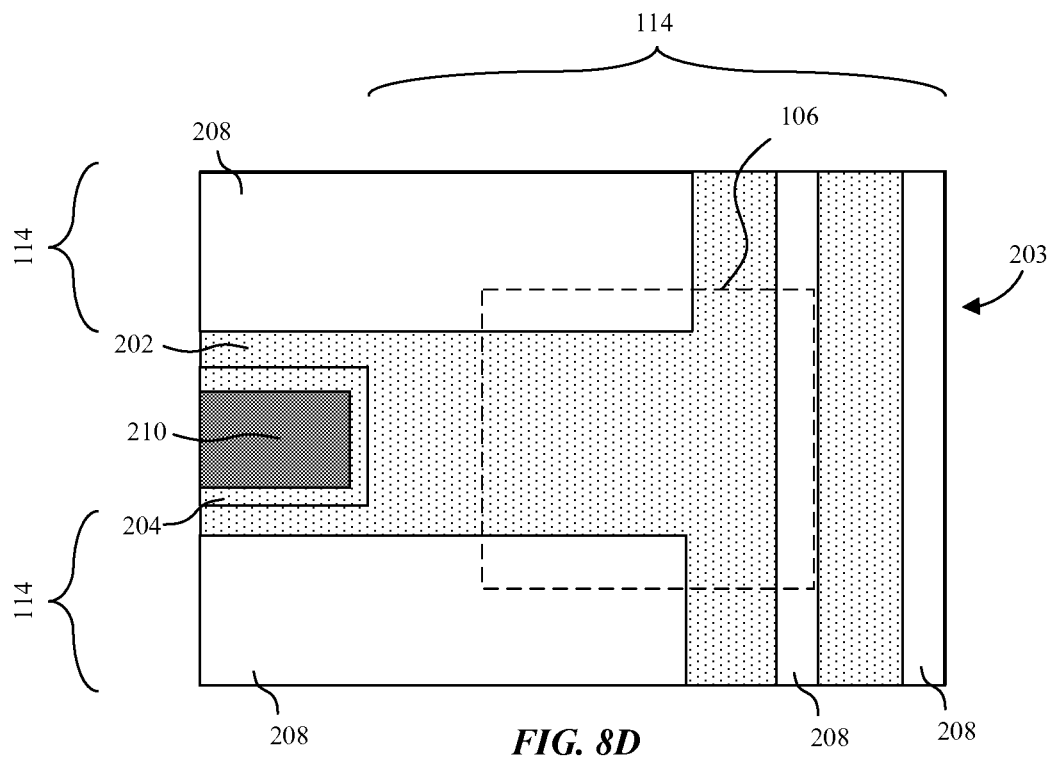
FIG. 8D is a schematic top view illustration of a supporting die in accordance with an embodiment.

FIGS. 8C-8D include cross-sectional side view and top view illustrations for a singulated die stack in accordance with an embodiment. The arrangement in FIGS. 8C-8D is similar to the cantilever configuration of FIGS. 8A-8B, with one edge being only partially supported by a support anchor. FIG. 8D is a schematic top view illustration of a supporting die 203 in which the support anchor 204 is only partially formed near one of the supporting die 203 edges. Thus, the supported contact area is reduced, and the hanging area 114 extends away from the supported contact area in both X-Y directions. For the exemplary rectangular package structure illustrated in FIG. 8D, an open air gap 206 may exist along three edges of substrate 102 of sensor die 103, and partially along a fourth edge being supported by support anchor 204. Such a configuration may also be characterized as a single-sided support cantilever shape. An outline of a diaphragm 104 cavity 106 is provided to illustrate the position of the sensor 110 over the air gap 206.

Figure 9A:
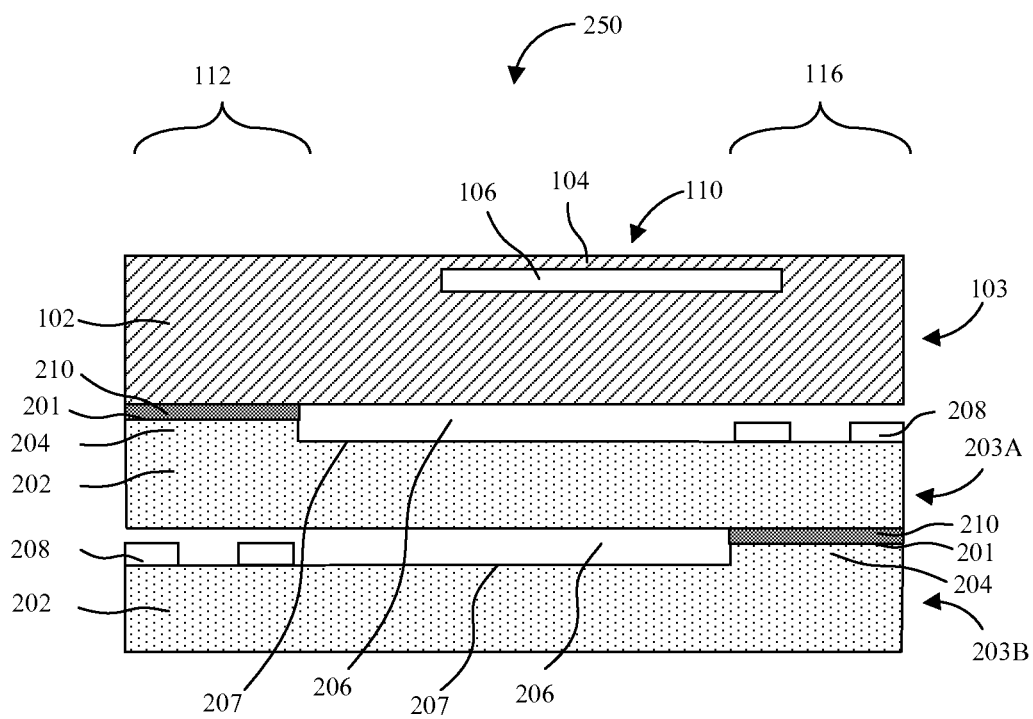
FIG. 9A is a cross-sectional side view illustration of a stacked sensor die and multiple supporting die in accordance with an embodiment.
Figure 9B:
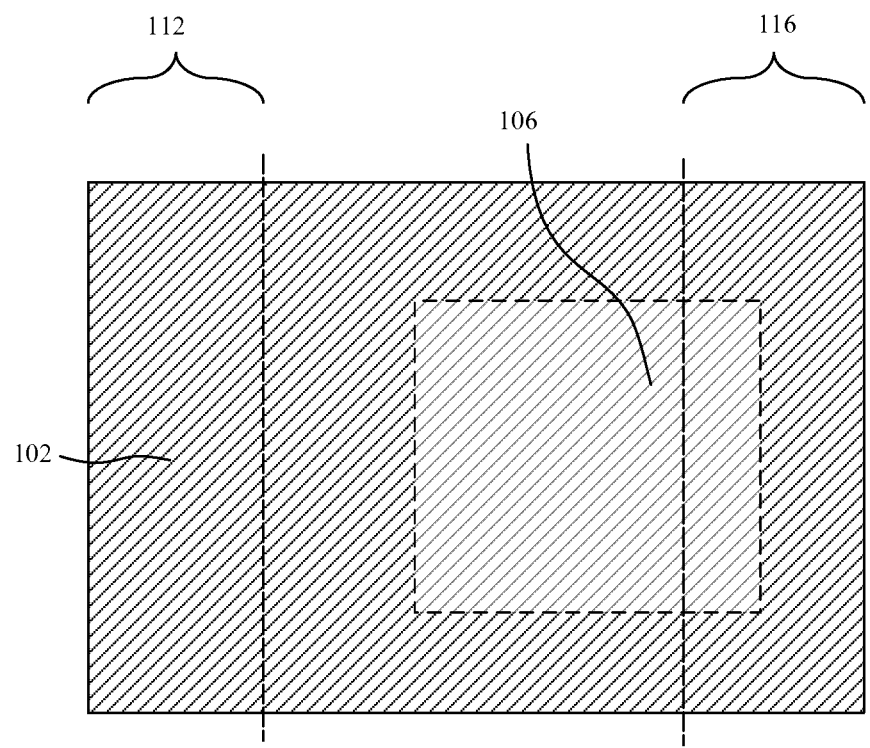
FIG. 9B is a top view illustration of a stacked sensor die and multiple supporting die in accordance with an embodiment.

Referring now to FIGS. 9A-9B, cross-sectional side view and top view illustrations are provided for a die stack 250 including multiple supporting die in accordance with an embodiment. The die stack 250 may be formed using a wafer level supporting die and air gap technique similar to that illustrated and described with regard to FIGS. 1-7. In such a configuration, the multiple supporting die may be used for additional stress isolation. In the particular embodiment illustrated, the sensor die 103 is bonded to a first supporting die 203A such than an air gap 206 exists between the sensor die 203A and the recess area 207 of the first supporting die 203A. A second supporting die 203B may be formed similarly as first supporting die 203A, including a top surface characterized by a recess area 207 and a support anchor 204 protruding above the recess area 207. In the embodiment illustrated in FIGS. 9A-9B, the first supporting die 203A is above and bonded to the support anchor 204 of the second supporting die 203B with a wafer bonding material 210, where the support anchor 204 of the first supporting die 203A is not directly above the support anchor 204 of the second supporting die 203B. In an embodiment, support anchors 204 of the first and second supporting die 203A, 203B are located on opposite sides of the die stack 250. For example, referring to FIG. 9B, the supported contact area 112 between the sensor die 103 and first supporting die 203A, and the supported contact area 116 between the first supporting die 203A and the second supporting die 203B can be located on opposite sides of the die stack 250. In an embodiment, the sensor 110 may be partially located directed above the supported contact area 116 (corresponding to the bond area between first supporting die 203A and support anchor 204 of second supporting die 203B), while the sensor 110 is not directly above the supported contact area 112 (corresponding to the bond area between sensor die 103 and support anchor 204 of first supporting die 203A).

Figure 10A:
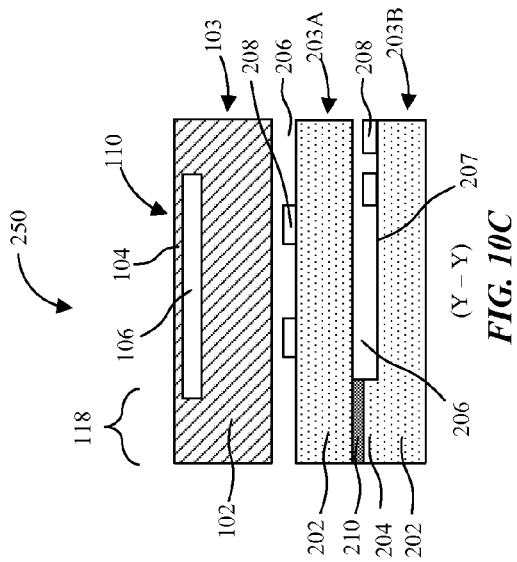
FIG. 10A is a top view illustration of a stacked sensor die and multiple supporting die in accordance with an embodiment.
Figure 10A:
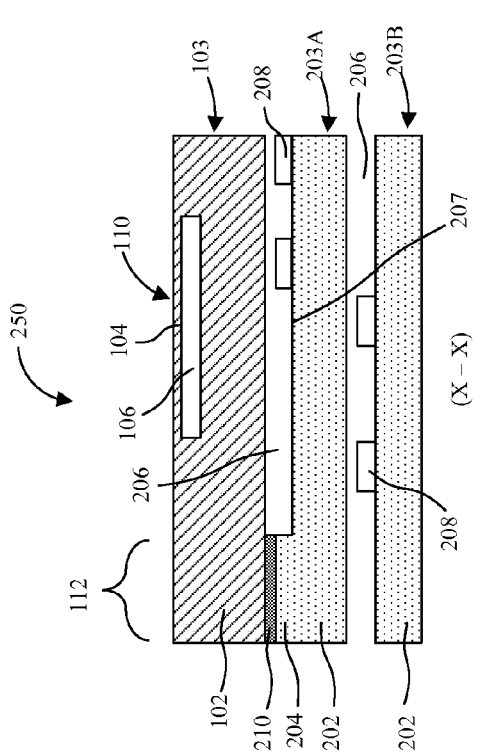
Figure 10A:
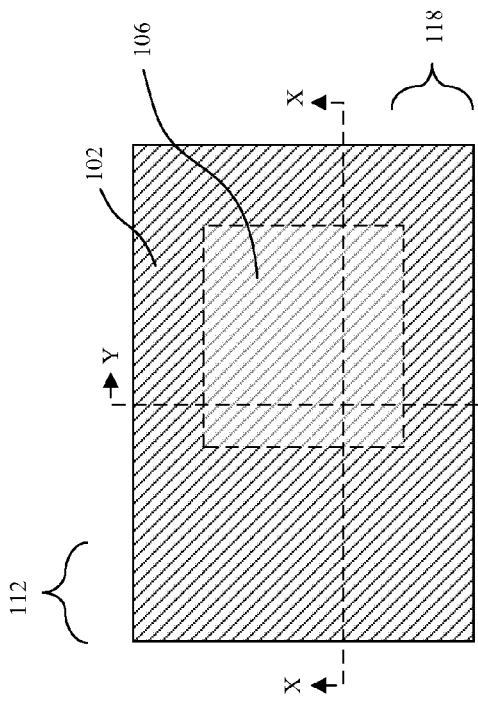

FIGS. 10A-10C provide cross-sectional side view and top view illustrations for a die stack 250 including multiple supporting die in accordance with an embodiment. The die stack 250 may be formed using a wafer level supporting die and air gap technique similar to that illustrated and described with regard to FIGS. 1-7. In the particular embodiment illustrated, FIG. 10B is taken along cross-section X-X of FIG. 10A, while FIG. 10C is taken along cross-section Y-Y of FIG. 10A. As illustrated, the sensor die 103 is bonded to a first supporting die 203A as previously described with supported contact area 112. A second supporting die 203B may be formed similarly as first supporting die 203A, including a top surface characterized by a recess area 207 and a support anchor 204 protruding above the recess area 207. In the embodiment illustrated in FIGS. 10A-10C, the first supporting die 203A is above and bonded to the support anchor 204 of the second supporting die 203B with a wafer bonding material 210 corresponding to supported contact area 118, where the support anchor 204 of the first supporting die 203A is aligned orthogonally with the support anchor 204 of the second supporting die 203B. In this manner, the first supporting die 203A may isolate bending in the Y-direction (orthogonal to X-X), while the second supporting die 203B may isolate bending in the X-direction (orthogonal to Y-Y). In this manner, contact area between the sensor die 103 and supporting dies 203A, 203B can be reduced while modulating bending from the bottom side of the package. Referring to FIG. 10A, support anchor 204 and corresponding supported contact area 112 between the sensor die 103 and first supporting die 203A, and support anchor 204 and corresponding supported contact area 118 between the first supporting die 203A and the second supporting die 203B may be orthogonal to each other. Support anchors 204 and corresponding supported contact areas 112, 118 may additionally overlap.

Thus far, each die stack 250 configuration has included a sensor die bonded to a support anchor in a single-sided support cantilever configuration such that a hanging area of the sensor die extends laterally from a contact area of the sensor die directly over the support anchor, and an air gap exists between the hanging area of the sensor die and the recess area, with the sensor of the sensor die positioned directly above the air gap. FIGS. 10D-10J provide additional configurations including a supporting die with a spring arms and a pivot platform in accordance with embodiments. In such configurations, the sensor die 103 may be bonded to a support anchor 204 on the pivot platform, and may hang over an air gap between the sensor die and supporting die 203 in a cantilever configuration. Additional stress isolation may be provided by the spring arms. In an embodiment, the sensor die 103 is larger than the contact area between the sensor die and the support anchor 204.

Figure 10E:
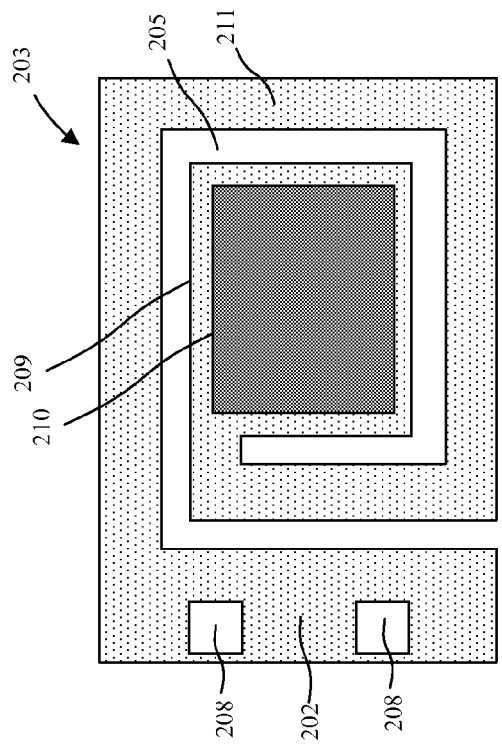
FIG. 10E is a top view illustration of a wafer bonding material applied to a supporting die with a spiral configuration and in accordance with an embodiment.
Figure 10D:
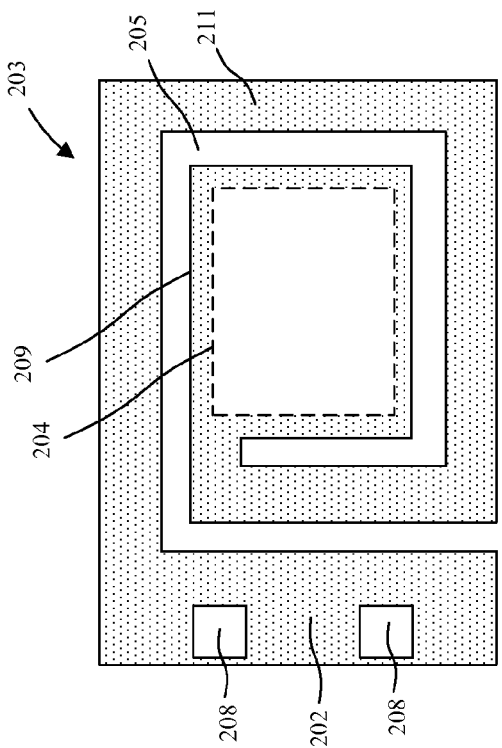
FIG. 10D is a top view illustration of a supporting die with a spiral configuration in accordance with an embodiment.

FIG. 10D is a top view illustration of a supporting die 203 with a spiral configuration in accordance with an embodiment. As illustrated, a supporting die 203 includes channels 205 formed through a base substrate 202 to form spring arms 211 and pivot platform 209. In the embodiment illustrated, the spring arms 211 are formed in a spiral configuration. The channels 205 may be formed through an entire thickness of the base substrate 202. A support anchor 204 protrudes from the pivot platform 209 to provide a contact surface. FIG. 10E is a top view illustration of a supporting die 203 after formation of a wafer bonding material 210 on the support anchor 204.

Figure 10F:
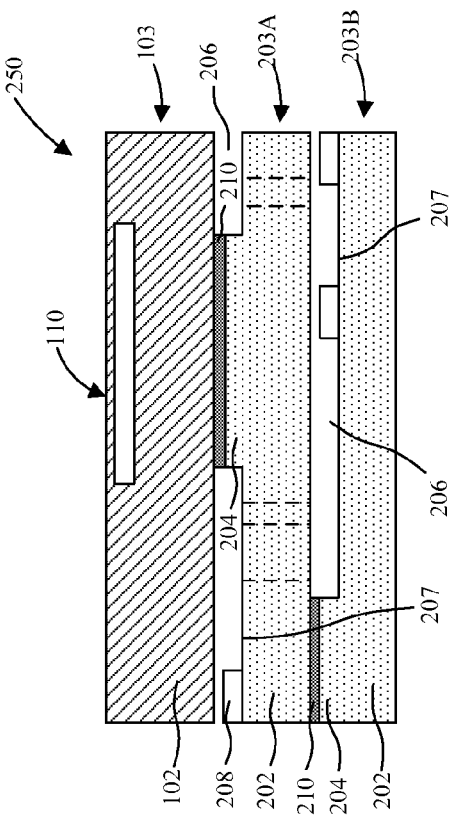
FIG. 10F is a cross-sectional side view illustration of a stacked sensor die and multiple supporting die including a supporting die with a spiral configuration in accordance with an embodiment.

FIG. 10F is a cross-sectional side view illustration of die stack 250 including a supporting die with a spiral configuration in accordance with an embodiment. The die stack 250 may be formed using a wafer level supporting die and air gap technique similar to that illustrated and described with regard to FIGS. 1-7. As shown in FIG. 10F, a sensor die 103 is bonded to a first supporting die 203A with spiral configuration as described with regard to FIGS. 10D-10E. The first supporting die 203A may additionally be bonded to a support anchor 204 of a second supporting die 203B. The support anchors 204 of the first and second supporting die 203A, 204B may be located at a variety of locations. In the particular embodiment illustrated, the support anchor 204 of the second supporting die 203B is located at a side edge of the die stack 250, and support anchor 204 of the first supporting die 203A is located at a more laterally central area of the die stack 250 consistent with a spiral configuration.

Figure 10G:
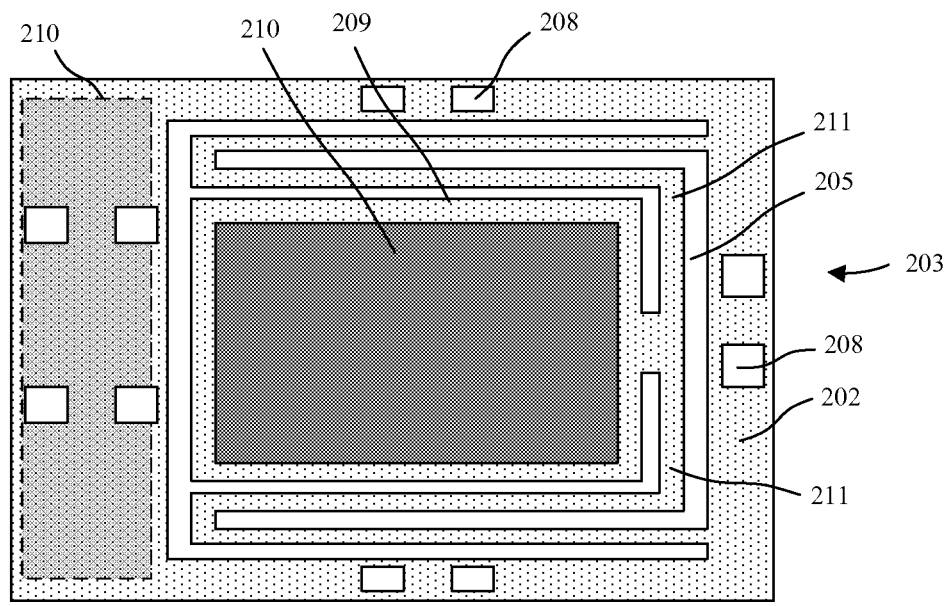
FIG. 10G is a top view illustration of a supporting die with a pivot platform and spring arms in accordance with an embodiment.

FIG. 10G is a top view illustration of a supporting die with a pivot platform and spring arms in accordance with an embodiment. As illustrated, a supporting die 203 includes channels 205 formed through a base substrate 202 to form spring arms 211 and pivot platform 209. In the embodiment illustrated, the two spring arms 211 are provided, with each spring arm including one or more turns (e.g. 90 degrees, or 180 degrees). This may increase the length and flexibility of the cantilever configuration of the spring arms. The channels 205 may be formed through an entire thickness of the base substrate 202. A support anchor 204 protrudes from the platform 209 to provide a contact surface for a sensor die. In an embodiment, the support anchor 204 is formed as a portion of the pivot platform 209 and rises above the spring arms 211. In an embodiment, the entire pivot platform 209 forms the support anchor 204 and rises above the spring arms 211. As shown in FIG. 10G, a wafer bonding material 210 can be located on a top surface of the support anchor 204 for bonding with a sensor die 103, and on a back surface (illustrated by dotted lines) for bonding with another supporting die.

Figure 10H:
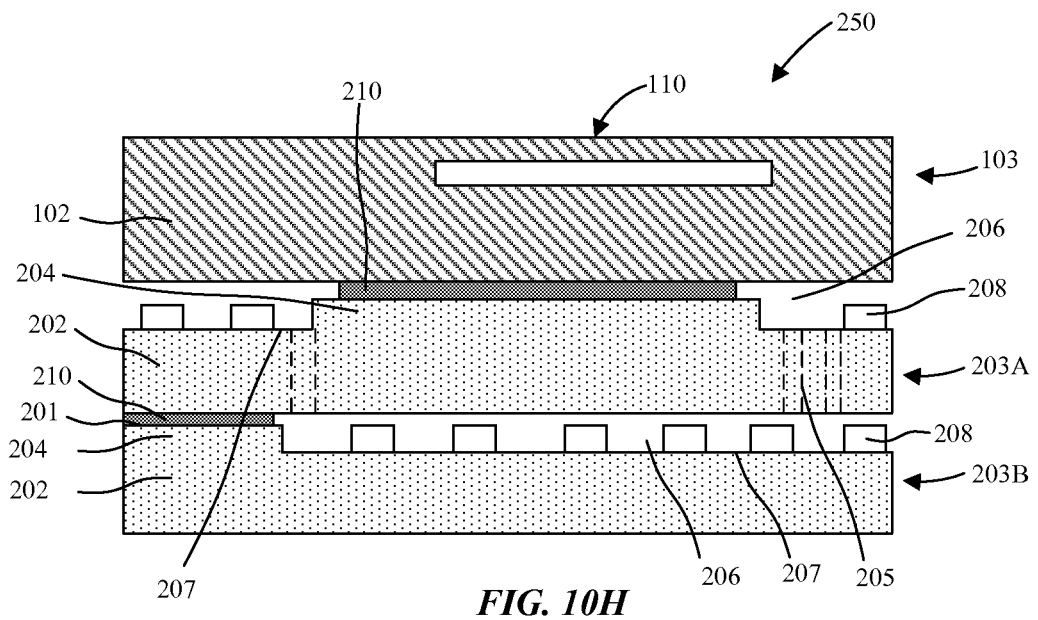
FIG. 10H is a cross-sectional side view illustration of a die stack including a supporting die with a pivot platform and spring arms in accordance with an embodiment.

FIG. 10H is a cross-sectional side view illustration of a die stack 250 including a supporting die with a pivot platform and spring arms in accordance with an embodiment. The die stack 250 may be formed using a wafer level supporting die and air gap technique similar to that illustrated and described with regard to FIGS. 1-7. As shown in FIG. 10H, a sensor die 103 is bonded to a first supporting die 203A with a pivot platform and spring arms as described with regard to FIG. 10G. The first supporting die 203A may additionally be bonded to a support anchor 204 of a second supporting die 203B. The support anchors 204 of the first and second supporting die 203A, 204B may be located at a variety of locations. In the particular embodiment illustrated, the support anchor 204 of the second supporting die 203B is located at a side edge of the die stack 250, and support anchor 204 of the first supporting die 203A is located at a more laterally central area of the die stack 250 consistent with a pivot platform surrounded by outer edges of the base substrate 202.

Figure 10I:
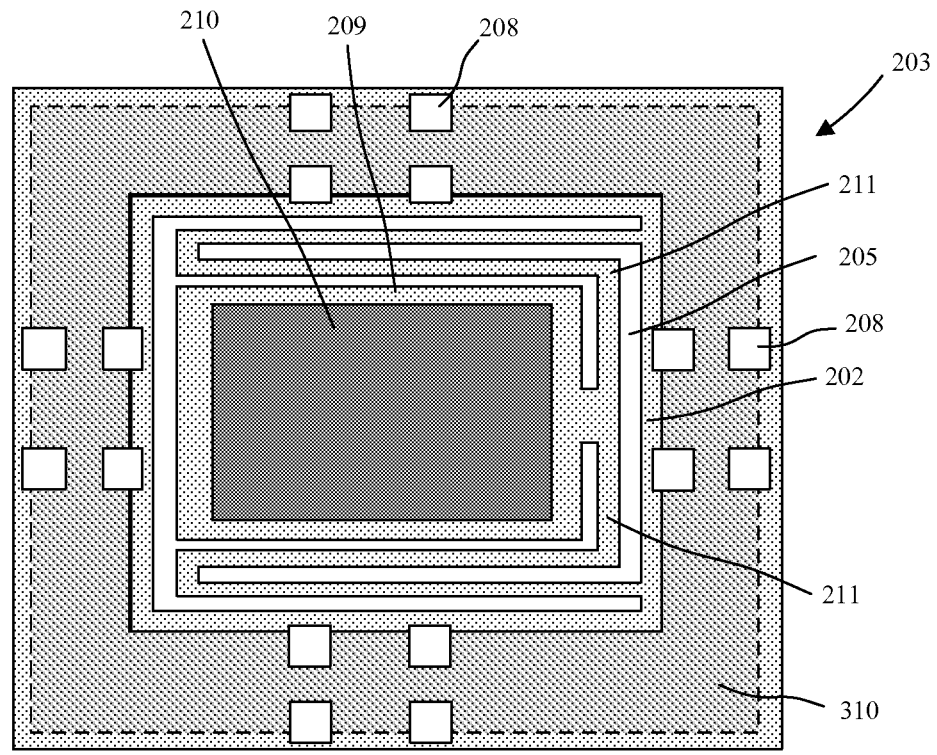
FIG. 10I is a top view illustration of a supporting die with a pivot platform and spring arms in accordance with an embodiment.

FIG. 10I is a top view illustration of a supporting die with a pivot platform and spring arms in accordance with an embodiment. FIG. 10I is similar to FIG. 10G, with one difference showing a die attach material 310 underneath the supporting die 203 and around the outer edges of the base substrate 202. In an embodiment, die attach material 310 is formed of an elastomeric material, such as silicone, which may be characterized as a high flexibility and low stress adhesive material employed in packaging. In an embodiment, the wafer bond material 210 forms a more rigid bond than the die attach material 310. Die attach material 310 may be a non-electrically conductive material. In accordance with some embodiments, conductive joints are not formed through die attach material 310, and wire bonding is used to make electrical connection to a surface mount substrate.

Figure 10J:
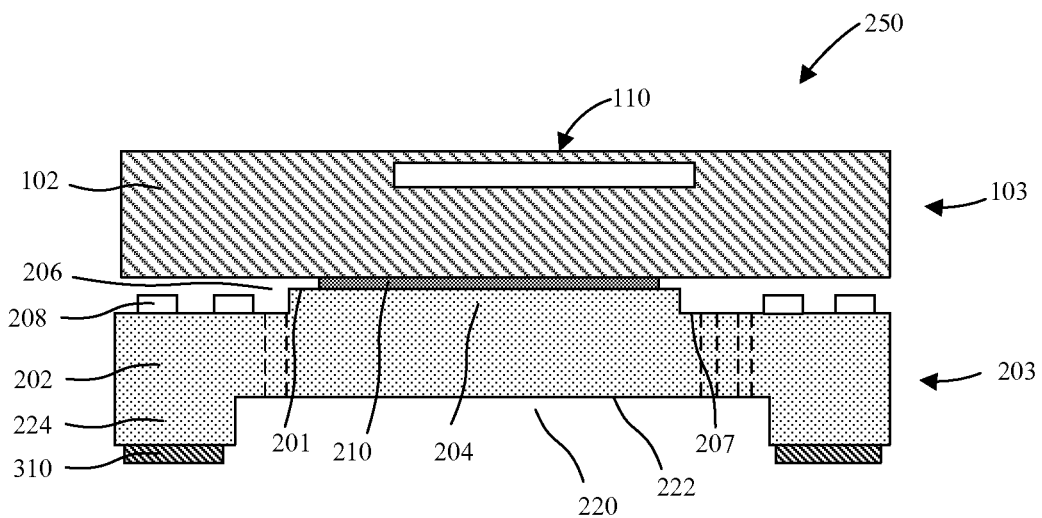
FIG. 10J is a sectional side view illustration of a die stack including a supporting die with a pivot platform and spring arms in accordance with an embodiment

FIG. 10J is a cross-sectional side view illustration of a die stack 250 including a supporting die with a pivot platform and spring arms in accordance with an embodiment. The die stack 250 may be formed using a wafer level supporting die and air gap technique similar to that illustrated and described with regard to FIGS. 1-7. As shown in FIG. 10J, a sensor die 103 is bonded to a supporting die 203 with a pivot platform and spring arms as described with regard to FIG. 10I. In the particular embodiment illustrated, the support anchor 204 of the supporting die 203 is located at a more laterally central area of the die stack 250 consistent with a pivot platform surrounded by outer edges of the base substrate 202. A die attach material 310 may be located on a back surface of the supporting die 203 along a periphery of the supporting die 203. Still referring to FIG. 10J, the back side of the supporting die may include a cavity 220 in which support anchors 224 extend from a recess area 222. In this manner, supporting die can be directly bonded to a substrate, such as a surface mount substrate, with a reduced contact area for stress isolation.

Figure 11A:
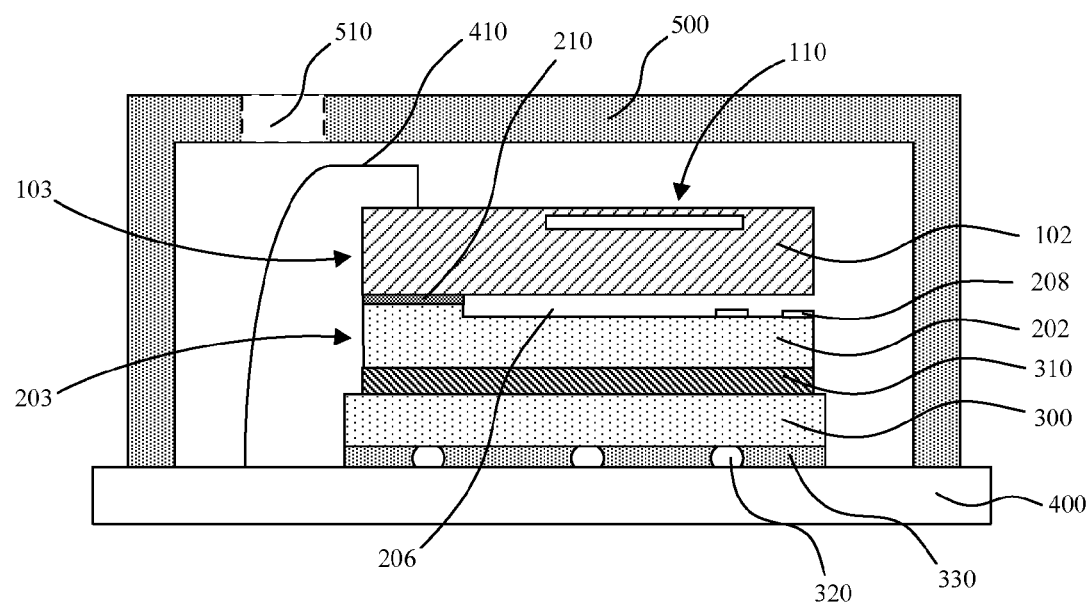
FIGS. 11A-11B are cross-sectional side view illustrations of pressure sensor packages integrated onto a surface mount substrates with flip chip and wire bonding in accordance with embodiments.

FIG. 11A is a cross-sectional side view illustration of a pressure sensor package integrated onto a surface mount substrate, such as an LGA, QFN, or ceramic substrate with flip chip and wire bonding in accordance with an embodiment. In an embodiment, the pressure sensor package includes a die stack including a pressure sensor die 103, supporting die 203, and air gap 206 formed with a wafer batch process for stress isolation from a bottom surface of the package adjacent the surface mount substrate 400. While FIG. 11A illustrates the integration of the die stack 250 illustrated and described with regard to FIGS. 8A-8B, it is understood that a number of configurations may be integrated onto the surface mount substrate in FIG. 11A, including the variations described and illustrated with regard to FIGS. 9A-10J. Referring again to FIG. 11A, the bonded sensor die 103 and supporting die 203 of FIGS. 8A-8B is bonded to an integrated circuit (IC) die 300 using a die attach material 310. In an embodiment, die attach material 310 is formed of an elastomeric material, such as silicone, which may be characterized as high flexibility and low stress adhesive material employed in packaging. In an embodiment, the wafer bond material 210 forms a more rigid bond than die attach material 310. Die attach material 310 may be a non-electrically conductive material. In accordance with some embodiments, conductive joints are not formed through die attach material 310, and wire bonding is used to make electrical connection to the sensor die. In an embodiment, IC die 300 is an application specific integrated circuit (ASIC) die. In an embodiment, IC die 300 is a field programmable gate array (FPGA) die.

As illustrated in FIG. 11A, the IC die 300 is flip chip bonded to the surface mount substrate 400 with bumps 320, and underfill material 330 such as an epoxy underfill material. IC die 300 may be bonded to the surface mount substrate 400 prior to or after bonding the supporting die 203 to the IC die 300. The sensor die 103 may then be electrically connected to the surface mount substrate 400 by wire bonding wire 410. In an embodiment, a lid 500 is then bonded to the surface mount substrate 400 using a suitable bonding material to provide mechanical protection to the die stack, wire 410, and pressure sensor 110. A pressure inlet 510 is provided in the lid 500 to allow an ambient external environment atmosphere inside the package for interaction with the pressure sensor 110. In an embodiment, the lid 500 surrounds the IC die 300, supporting die 203, and the sensor die 103.

Figure 11B:
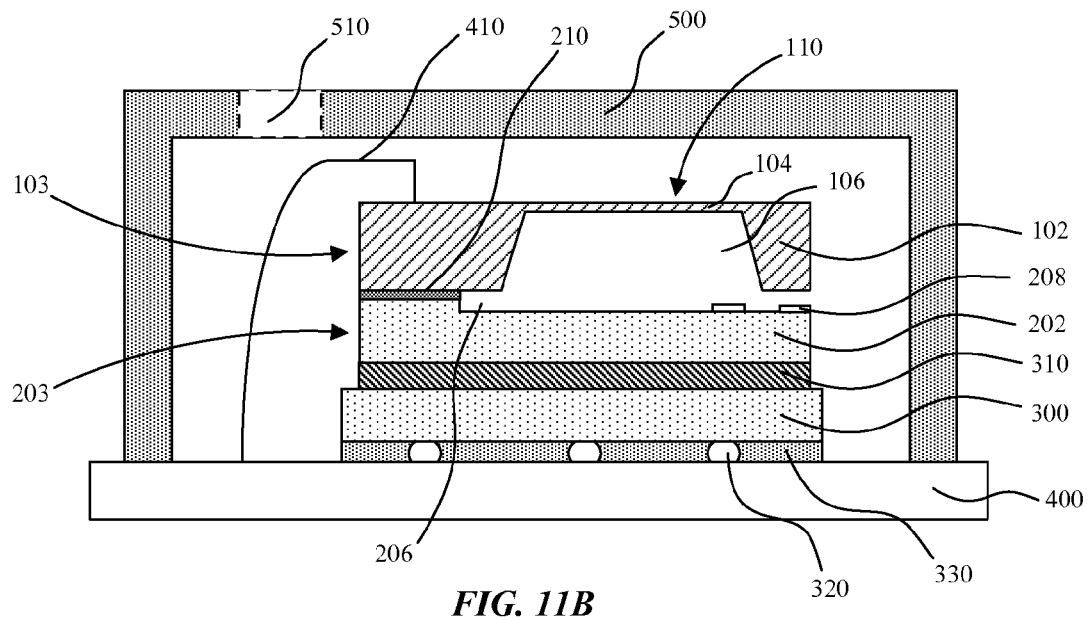

In the particular embodiment illustrated in FIG. 11A, sensor die 103 is illustrated as including a surface-micromachined pressure sensor 110. Embodiments are not so limited. For example, FIG. 11B is a cross-sectional side view illustration of a pressure sensor package similar to that illustrated in FIG. 11A with a bulk-micromachined pressure sensor 110 in accordance with an embodiment.

Figure 11C:
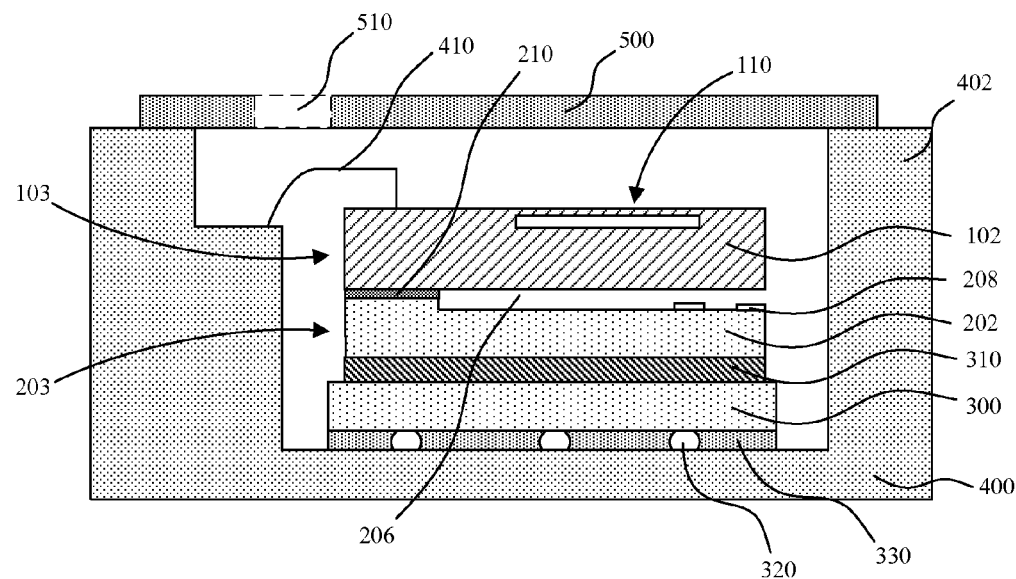
FIGS. 11C-11D are cross-sectional side view illustrations of pressure sensor packages integrated onto air cavity ceramic substrates with flip chip and wire bonding in accordance with embodiments.
Figure 11D:
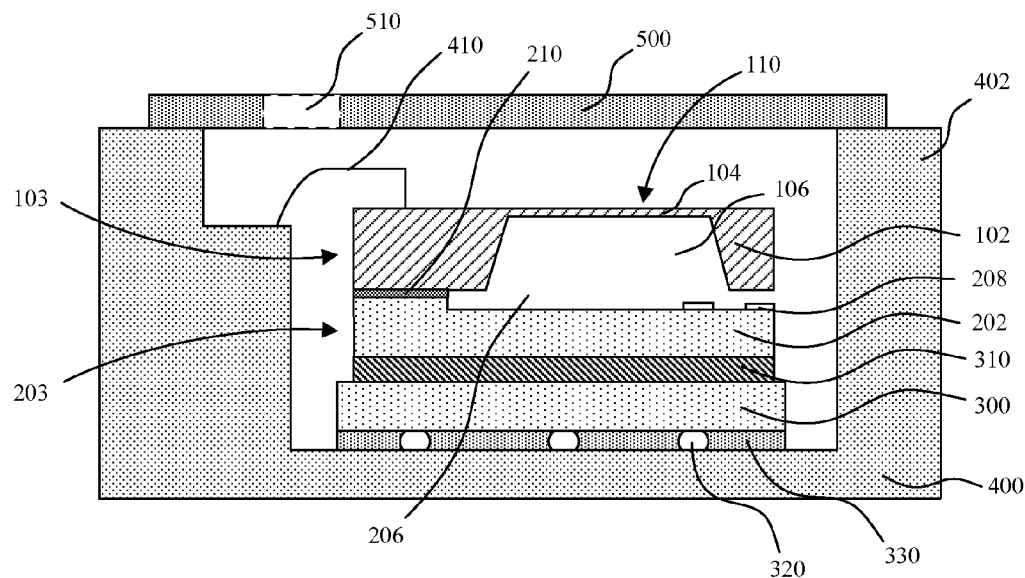

FIGS. 11C-11D are cross-sectional side view illustrations of pressure sensor packages integrated onto air cavity ceramic substrates with flip chip and wire bonding in accordance with embodiments. FIGS. 11C-11D are similar to those embodiments illustrated and described with regard to FIGS. 11A-11B, with one difference being that surface mount substrate 400 is an air cavity ceramic substrate including sidewalls 402. In such embodiments, the sidewalls 402 surround the IC die 300, supporting die 203 and sensor die 103. A lid 500 including a pressure inlet 510 is bonded to the sidewalls 402. Similar to FIGS. 11A-11B, the IC die 300 may be flip chip bonded to the air cavity ceramic surface mount substrate 400 and sensor die 103 wire bonded to the air cavity ceramic surface mount substrate 400.

Figure 11E:
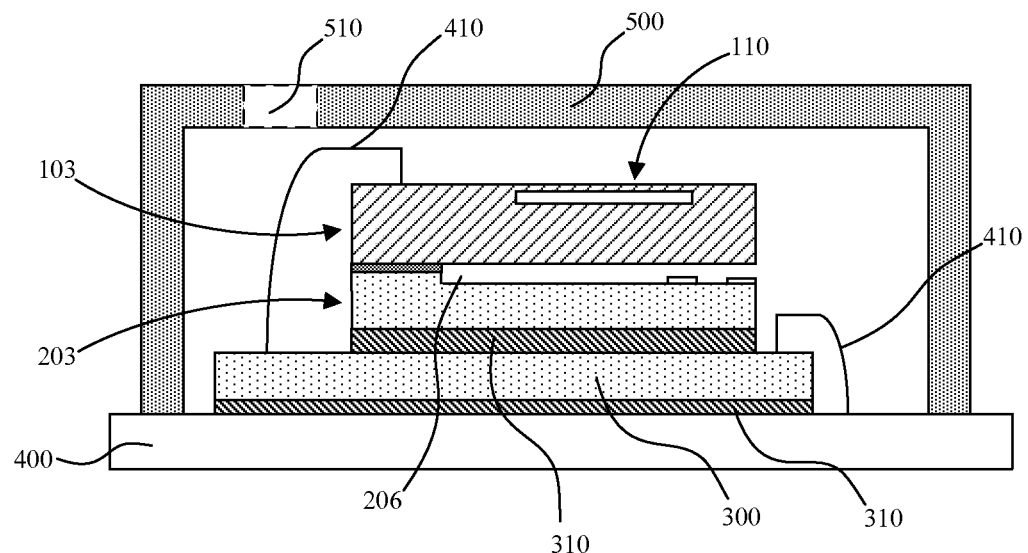
FIGS. 11E-11F are cross-sectional side view illustrations of pressure sensor packages integrated onto surface mount substrates with wire bonding in accordance with embodiments.
Figure 11F:
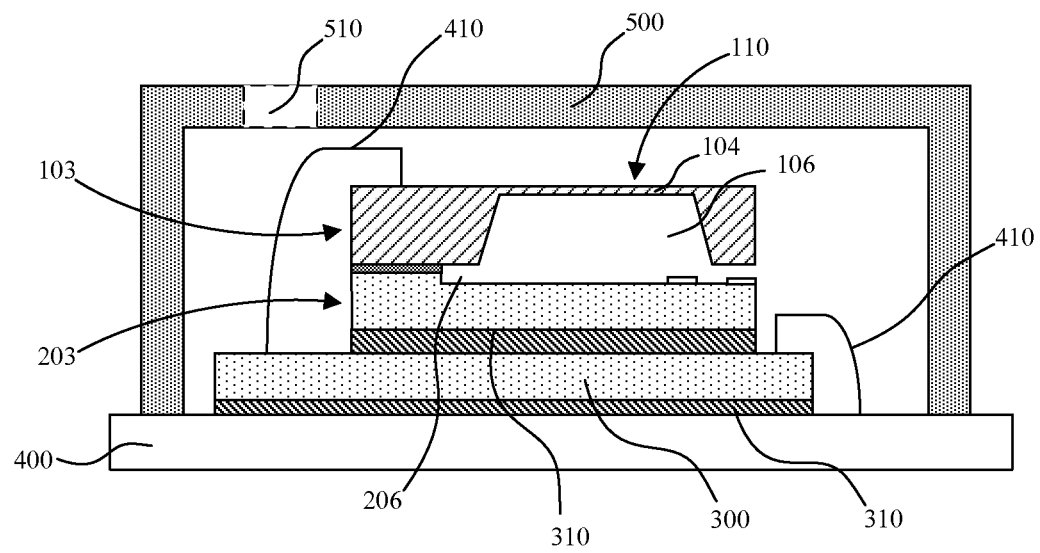

FIGS. 11E-11F are cross-sectional side view illustrations of pressure sensor packages integrated onto surface mount substrates with wire bonding in accordance with embodiments. While the previous embodiments described and illustrated with regard to FIGS. 11A-11D have disclosed flip chip bonding to the surface mount substrate 400, this is not required. In the embodiments illustrated in FIGS. 11E-11F, IC die 300 is bonded to the surface mount substrate 4000 with a die attach material 310 and electrically connected to the surface mount substrate 400 with wire bonds 410.

Figure 12:
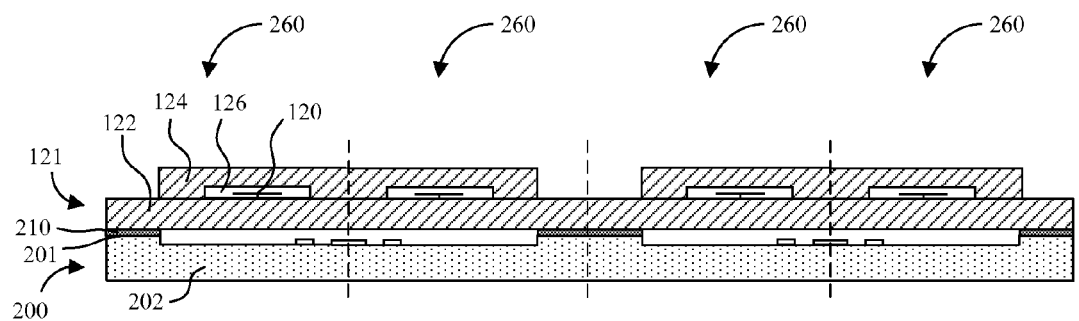
FIG. 12 is a cross-sectional side view illustration a bonded motion sensor wafer and supporting wafer in accordance with an embodiment.
Figure 13A:
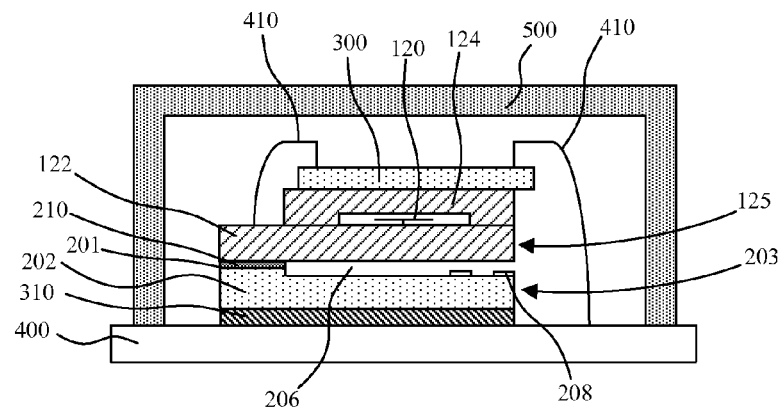
FIG. 13A is a cross-sectional side view illustration of a motion sensor package integrated onto a surface mount substrate in accordance with an embodiment.
Figure 13B:
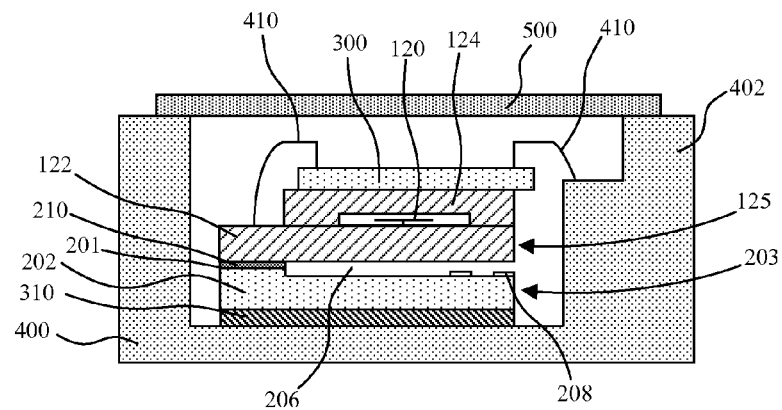
FIG. 13B is a cross-sectional side view illustration of a motion sensor package integrated onto an air cavity ceramic substrate in accordance with an embodiment.

FIGS. 12-13B are cross-sectional side view illustrations for manners of integrating a motion sensor package onto a surface mount substrate in accordance with embodiments. In an embodiment, the motion sensor package includes a motion sensor die 125, supporting die 203, and air gap 206 formed with a wafer batch process for stress isolation from a bottom surface of the package adjacent the surface mount substrate 400. Referring to FIG. 12 a cross-sectional side view illustration is provided of a motion sensor wafer 121 bonded to a supporting wafer 200 with wafer bonding material 210, prior to singulation of individual die stacks 260 along dotted singulation lines. The motion sensor wafer 121 may include a base substrate 122 and caps 124 surrounding motion sensors 120. As shown, each cap 124 may form a cavity 126 around a corresponding motion sensor 120, which is not required to be exposed to the atmosphere outside of cap 124 for operation of the motion sensor. For example, a suitable motion sensor may be a comb driver.

Referring now to FIG. 13A, a die stack 260 including a motion sensor die 125, supporting die 203, and air gap 206 is integrated with surface mount substrate 400, such as an LGA, QFN, or ceramic substrate. Each motion sensor die 125 may include a singulated portion of the base substrate 122, and cap 124 surrounding a corresponding motion sensor 120. It is understood that a number of die stack configurations may be integrated onto the surface mount substrate in FIG. 13A, including the variations similar to those described and illustrated with regard to FIGS. 9A-10J. Referring again to FIG. 13A, the bonded motion sensor die 125 and supporting die 203 is bonded to a surface mount substrate, such as an LGA, QFN, or ceramic substrate 400 using a die attach material 310. In an embodiment, die attach material 310 is formed of an elastomeric material, such as silicone, which may be characterized as a high flexibility and low stress adhesive material employed in packaging. In an embodiment, the wafer bond material 210 forms a more rigid bond than die attach material 310. Die attach material 310 may be a non-electrically conductive material. In accordance with some embodiments, conductive joints are not formed through die attach material 310, and wire bonding is used to make electrical connection to the sensor die. In an embodiment, an IC die 300 is bonded the motion sensor die 125, such as bonded to the cap 124. In an embodiment, IC die 300 is an application specific integrated circuit (ASIC) die. In an embodiment, IC die 300 is a field programmable gate array (FPGA) die.

The IC die 300 may then be electrically connected to the surface mount substrate 400 and motion sensor die 125 by wire bonding wires 410. In an embodiment, a lid 500 is then bonded to the surface mount substrate 400 using a suitable bonding material to provide mechanical protection to the die stack and wires 410. A pressure inlet is not required in the lid 500 to allow an ambient external environment atmosphere inside the package for interaction with the motion sensor 120. In an embodiment, the lid 500 surrounds the IC die 300, supporting die 203, and the sensor die 125.

FIG. 13B is a cross-sectional side view illustration of a motion sensor package integrated onto air cavity ceramic substrate with wire bonding in accordance with an embodiment. FIG. 13B is similar to the embodiment illustrated and described with regard to FIG. 13A, with one difference being that surface mount substrate 400 is an air cavity ceramic substrate including sidewalls 402. In such an embodiment, the sidewalls 402 surround the IC die 300, supporting die 203, and the sensor die 125. A lid 500 including a pressure inlet 510 is bonded to the sidewalls 402. Similar to FIG. 13A, the IC die 300 and sensor die 125 may be wire bonded to the air cavity ceramic surface mount substrate 400.

Figure 14:
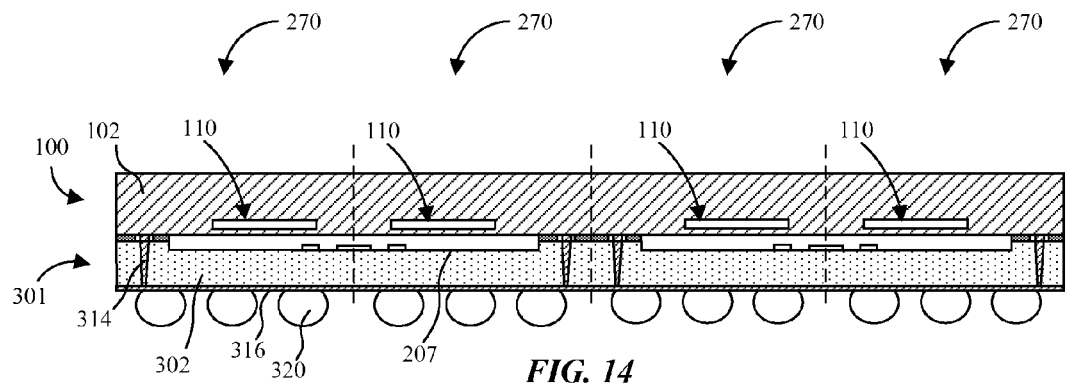
FIG. 14 is a cross-sectional side view illustration a bonded pressure sensor wafer and supporting IC wafer in accordance with an embodiment.
Figure 15A:
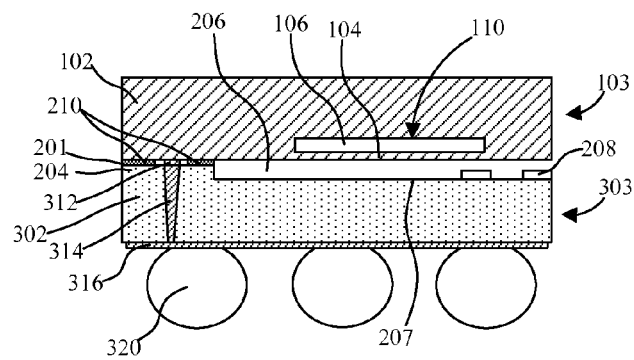
FIGS. 15A-15B are cross-sectional side view illustrations of wafer level pressure sensor packages in accordance with embodiments.
Figure 15B:
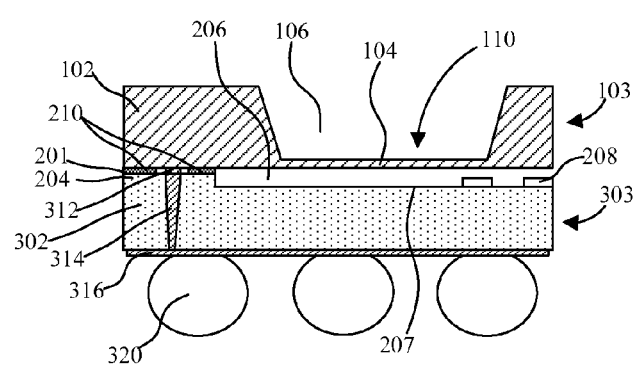

FIGS. 14-15B are cross-sectional side view illustrations for manners of integrating a pressure sensor in a wafer level package in accordance with embodiments. In an embodiment, the pressure sensor package includes a pressure sensor die 103, supporting IC die 303, and air gap 206 formed with a wafer batch process for stress isolation from a bottom surface of the package. Referring to FIG. 14 a cross-sectional side view illustration is provided of a pressure sensor wafer 100 bonded to a supporting IC wafer 301 with wafer bonding material 210, prior to singulation of individual die stacks 270 along dotted singulation lines. The pressure sensor wafer 100 may include a base substrate 102 pressure sensors 110, such as diaphragms 104 formed over cavities 106. The supporting IC wafer 301 may be formed similar to a supporting wafer 200 described above, including recess areas 207 etched into a base substrate 302, support anchors 204 that protrude above the recess areas 207, and stopper structures 208. In an embodiment, the supporting IC wafer 301 additionally includes through vias 314 for routing signal to output leads, a backside redistribution layer 316 and topside contact 312.

Referring now to FIG. 15A, in an embodiment a wafer level pressure sensor package includes a die stack 270 including a pressure sensor die 103, supporting IC die 303, and air gap 206. The supporting IC die 303 includes a top surface 201 characterized by a recess area 207 and a supporting anchor 204 protruding above the recess area. A through via 314 extends through base substrate 302 of the supporting IC die 303 from a bottom surface of the base substrate 302 adjacent the redistribution layer 316 to the top surface of the base substrate 302 along the support anchor 204. The sensor die 103 is bonded to the support anchor 204 such at an air gap 206 exists between the sensor die 103 and the recess area 207, and the sensor die 103 includes a pressure sensor 110 positioned directly above the air gap 206. A plurality of ball bumps 320 can be placed on the redistribution layer 316 for integrating the package, for example with a printed circuit board. In an embodiment, the supporting IC die 303 is an application specific integrated circuit (ASIC) die. In an embodiment, the supporting IC die 303 is a field programmable gate array (FPGA) die. In this aspect, the supporting IC die 303 is used for both operating the pressure sensor, and isolating stress from the pressure sensor. In the particular embodiment illustrated, the diaphragm 104 of the pressure sensor 110 is immediately adjacent the air cavity 106. In such a configuration the diaphragm is mechanically protected within the package and a separate lid is not required. In addition, such a configuration may be compatible for mounting the package with a pick and place tool, e.g. picking up the top side of the pressure sensor die with the pick and place tool. Furthermore, the air cavity 106 also functions as a pressure inlet for operation of the pressure sensor 110 in such a configuration. In the particular embodiment illustrated in FIG. 15A, sensor die 103 is illustrated as including a surface-micromachined pressure sensor 110. Embodiments are not so limited. For example, FIG. 15B is a cross-sectional side view illustration of a pressure sensor package similar to that illustrated in FIG. 15A with a bulk-micromachined pressure sensor 110 in accordance with an embodiment. It is understood that the die stacks 270 illustrated in FIGS. 15A-15B may assume a number of modified configurations, including the variations similar to those described and illustrated with regard to FIGS. 9A-10J.

Figure 16:
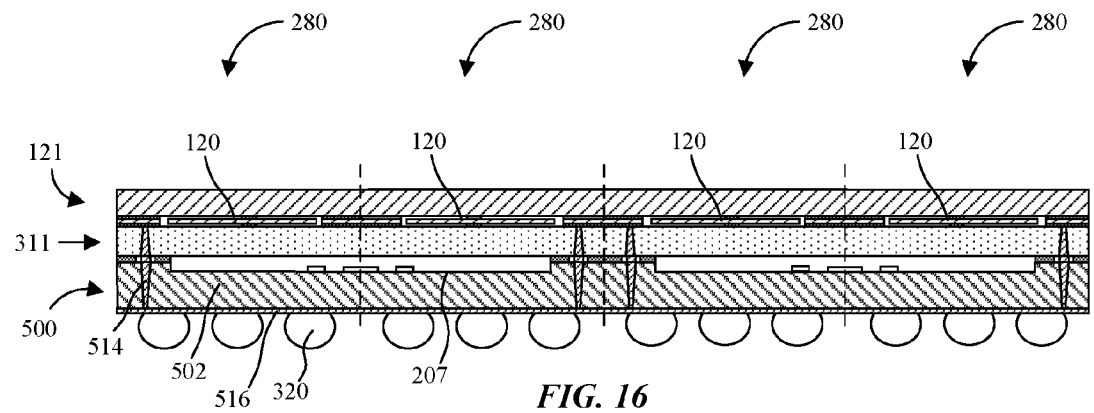
FIG. 16 is a cross-sectional side view illustration a bonded motion sensor wafer, IC wafer, and supporting interposer wafer in accordance with an embodiment.
Figure 17:
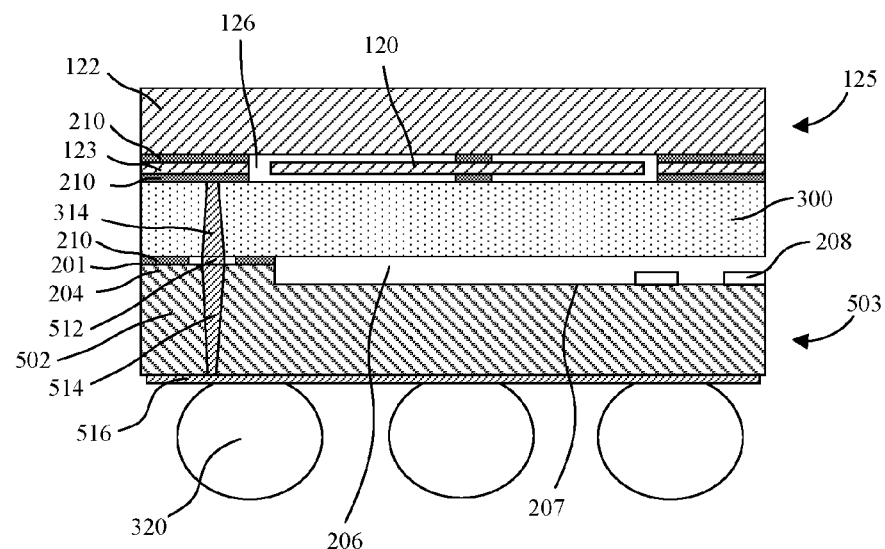
FIG. 17 is a cross-sectional side view illustration of a wafer level motion sensor package in accordance with an embodiment.

FIGS. 16-17 are cross-sectional side view illustrations for a manner of integrating a motion sensor in a wafer level package in accordance with an embodiment. In an embodiment, the motion sensor package includes a motion sensor die 125, IC die 300, supporting interposer die 503, and air gap 206 formed with a wafer batch process for stress isolation from a bottom surface of the package.

Referring to FIG. 16 a cross-sectional side view illustration is provided of a motion sensor wafer 121 and IC wafer 311 bonded to a supporting interposer wafer 500 with wafer bonding material 210, prior to singulation of individual die stacks 280 along dotted singulation lines. The motion sensor wafer 121 may include a base substrate 122, pressure sensors 120, sidewalls 123 surrounding the pressure sensors 120. For example, the motion sensor wafer 121 may be fabricated with a wafer bonding process of multiple wafers to form the pressure sensors 120 surrounded by sidewalls 123. Sidewalls 123 may form a cavity 126 around a corresponding motion sensor 120, which is not required to be exposed to an ambient external environment atmosphere outside of cavity 126 for operation of the motion sensor. For example, a suitable motion sensor may be a comb driver. The IC wafer 311 may include a plurality of through vias 314 extending through a thickness of the IC wafer substrate 300, such as a silicon substrate. The supporting interposer wafer 500 may be formed similar to a supporting wafer 200 described above, including recess areas 207 etched into a base substrate 502, support anchors 204 that protrude above the recess areas 207, and stopper structures 208. In an embodiment, the supporting interposer wafer 500 additionally includes through vias 514 for routing signal to output leads, a backside redistribution layer 516 and topside contact 512.

Referring now to FIG. 17, in an embodiment a wafer level motion sensor package includes a die stack 280 including a motion sensor die 125, IC die 300, supporting interposer die 503, and air gap 206. The supporting interposer die 503 includes a top surface 201 characterized by a recess area 207 and a supporting anchor 204 protruding above the recess area. A through via 514 extends through base substrate 502 of the supporting interposer die 503 from a bottom surface of the base substrate 502 adjacent the redistribution layer 516 to the top surface of the base substrate 502 along the support anchor 204. The IC die 300 is bonded to the support anchor 204 such at an air gap 206 exists between the IC die 300 and the recess area 207. The sensor die 125 is bonded to the IC die 300, and includes a motion sensor 120 positioned directly above the air gap 206. A plurality of ball bumps 320 can be placed on the redistribution layer 516 for integrating the package, for example with a printed circuit board. In an embodiment, IC die 300 is an application specific integrated circuit (ASIC) die. In an embodiment, IC die 300 is a field programmable gate array (FPGA) die. In the particular embodiment illustrated, the motion sensor 120 is contained internally within the package and a lid is not required for mechanical protection. In addition, such a configuration may be compatible for mounting the package with a pick and place tool, e.g. picking up the top side of the motion sensor die with the pick and place tool. It is understood that the die stack 280 illustrated in FIG. 17 may assume a number of modified configurations, including the variations similar to those described and illustrated with regard to FIGS. 9A-10J.

In utilizing the various aspects of the embodiments, it would become apparent to one skilled in the art that combinations or variations of the above embodiments are possible for forming a sensor package. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A sensor package comprising:
 a supporting die comprising a recess area, a support anchor protruding above the recess area, and a first pair of laterally opposite edges including a first supporting die edge adjacent the support anchor and a second supporting die edge; and
 a sensor die bonded to the support anchor in a single-sided support cantilever configuration such that a hanging area of the sensor die extends laterally from a contact area of the sensor die directly over the support anchor and an air gap exists between the hanging area of the sensor die and the recess area, and the sensor die comprises a sensor positioned directly above the air gap and a second pair of laterally opposite edges including a first sensor die edge adjacent the contact area of the sensor die and a second sensor die edge along the hanging area of the sensor die;
 wherein the single-sided support cantilever configuration is to divert stress away from the sensor, the first supporting die edge is coplanar with the first sensor die edge, and the second supporting die edge is coplanar with the second sensor die edge.

2. The sensor package of claim 1, further comprising a stopper structure protruding above the recess area.

3. The sensor package of claim 2, wherein the stopper structure and support anchor are integrally formed.

4. The sensor package of claim 1,
 further comprising a second supporting die characterized by a second recess area and a second support anchor protruding above the second recess area;
 wherein the supporting die is above and bonded to the second supporting die in a single-sided support cantilever configuration.

5. The sensor package of claim 1, wherein the sensor die comprises a pressure sensor positioned directly above the air gap.

6. The sensor package of claim 5, further comprising an integrated circuit (IC) die, and the supporting die is bonded to the IC die.

7. The sensor package of claim 6, further comprising a surface mount substrate selected from the group consisting of a land grid array (LGA), quad flat no-leads (QFN), and ceramic substrate, and the IC die is bonded to the surface mount substrate.

8. The sensor package of claim 7, further comprising a lid bonded to the surface mount substrate, wherein the lid surrounds the IC die, the supporting die, and the sensor die, and the lid includes a pressure inlet.

9. The sensor package of claim 7, further comprising a wire bond electrically connecting the sensor die to the surface mount substrate.

10. The sensor package of claim 7, further comprising a first wire bond electrically connecting the sensor die to the IC die, and a second wire bond electrically connecting the IC die to the surface mount substrate.

11. The sensor package of claim 1, wherein the sensor die comprises a motion sensor positioned directly above the air gap; and further comprising an integrated circuit (IC) die bonded to the sensor die.

12. The sensor package of claim 11, further comprising a wire bond electrically connecting the IC die to the sensor die.

13. The sensor package of claim 11, further comprising a surface mount substrate selected from the group consisting of an LGA, QFN, and ceramic substrate, and the supporting die is bonded to the surface mount substrate.

14. The sensor package of claim 13, further comprising a wire bond electrically connecting the IC die to the surface mount substrate.

15. The sensor package of claim 14, further comprising a lid over the motion sensor die, wherein the lid is bonded to the surface mount substrate, and the lid surrounds the supporting die, the sensor die, and the IC die.

16. The sensor package of claim 1, further comprising a through via extending through a base substrate of the supporting die.

17. The sensor package of claim 16, wherein the supporting die is selected from the group consisting of an interposer and integrated circuit (IC) die.

18. The sensor package of claim 17, wherein the supporting die is an IC die, and the sensor die comprises a pressure sensor positioned directly above the air gap.

19. The sensor package of claim 18, wherein the pressure sensor comprise a diaphragm immediately adjacent the air gap.

20. The sensor package of claim 17, wherein the supporting die is an interposer die, and the sensor die comprises a motion sensor positioned directly above the air gap.

21. The sensor package of claim 20, further comprising an integrated circuit (IC) die bonded to the support anchor such that the air gap exists between the IC die and the recess area, and the sensor die is bonded to the IC die.

22. The sensor package of claim 21, further comprising a second through via extending through the IC die.

* * * * *